United States Patent [19]

Sassa et al.

[11] Patent Number: 4,750,969
[45] Date of Patent: Jun. 14, 1988

[54] METHOD FOR GROWING SINGLE CRYSTALS OF DISSOCIATIVE COMPOUND SEMICONDUCTOR

[75] Inventors: Koichi Sassa, Fuchu; Kenji Tomizawa, 1-380-38, Yoshinocho, Ohmiya-shi, Saitama, both of Japan

[73] Assignees: Research Development Corporation of Japan, Tokyo; Kenji Tomizawa, Ohmiya, both of Japan

[21] Appl. No.: 878,548

[22] Filed: Jun. 25, 1986

[30] Foreign Application Priority Data

Jun. 27, 1985 [JP] Japan .................................. 60-138984

[51] Int. Cl.$^4$ ............................................ C30B 15/02
[52] U.S. Cl. .................... 156/607; 156/606; 156/DIG. 70; 156/DIG. 81; 156/DIG. 90; 156/617.1; 422/249
[58] Field of Search ................ 422/249; 156/607, 606, 156/617 SP, DIG. 70, DIG. 81, DIG. 90

[56] References Cited

U.S. PATENT DOCUMENTS

| 2,892,739 | 6/1959 | Rusler | 422/249 |
|---|---|---|---|
| 3,002,824 | 10/1961 | Francois | 156/617 SP |
| 3,088,853 | 5/1963 | Harper | 156/DIG. 93 |
| 3,198,606 | 8/1965 | Lyons | 422/249 |
| 3,615,878 | 10/1971 | Chang et al. | 156/617 SP |
| 3,716,345 | 2/1973 | Grabmaier | 156/617 SP |
| 3,741,817 | 6/1973 | Bienert et al. | 156/607 |
| 4,036,595 | 7/1977 | Lorenzini et al. | 422/249 |
| 4,203,951 | 5/1980 | Goriletsky et al. | 422/249 |
| 4,401,487 | 8/1983 | Lockwood | 156/624 |
| 4,431,476 | 2/1984 | Watanabe et al. | 156/607 |
| 4,478,675 | 10/1984 | Akai | 156/607 |
| 4,496,424 | 1/1985 | Terashima et al. | 156/607 X |

FOREIGN PATENT DOCUMENTS

| 159113 | 10/1985 | European Pat. Off. | 156/617 SP |
|---|---|---|---|
| 1934369 | 1/1971 | Fed. Rep. of Germany | 156/617 SP |
| 2245250 | 3/1974 | Fed. Rep. of Germany | 156/617 SP |
| 59-83995 | 5/1984 | Japan | 156/617 SP |
| 996008 | 6/1965 | United Kingdom | 156/607 |

Primary Examiner—John Doll
Assistant Examiner—Robert M. Kunemund
Attorney, Agent, or Firm—Flynn, Thiel, Boutell & Tanis

[57] ABSTRACT

A method for growing single crystals of a dissociative compound semiconductor which are pulled in an atmosphere of a gas of a volatile component of the dissociative compound filled in an inner chamber sealed within a growth apparatus is provided wherein the space of the inner chamber is divided into different parts by means of partition wall, which is disposed in the inner chamber and the lower part of which is immersed in a melt contained in a crucible, thereby high quality single crystals with a correct stoichiometric composition can be grown under the constant conditions of temperature and pressure without detrimental effects due to thermal convection in the crystal growth region and the melt. The partition wall may be made either of a monolithic structure or a composite structure capable of being divided into two parts, an upper member and a lower member like a float, the upper part of the lower member is vertically movably inserted into upper member.

9 Claims, 5 Drawing Sheets

METHOD FOR GROWING SINGLE CRYSTALS OF DISSOCIATIVE COMPOUND SEMICONDUCTOR

BACKGROUND OF THE INVENTION

1. [Field of the Invention]

The present invention relates to a method for growing single crystals of a dissociative compound semiconductor useful for IC substrates of high electrical resistivity and optical device substrates with high dopant concentration 2. [Description of the Prior Art]

In known methods for growing single crystals of a dissociative compound semiconductor, a pulling process (referred to as the Czochralski method) can readily provide round wafers with a <100>direction and is advantageous in the production process of IC or optical devices. In the crystal growth of a dissociative substance, it is required to prevent the escape of a volatile component of the dissociative substance. Various methods which are roughly classified into two types have been employed for this requirement. A first method is the Liquid Encapsulated Czochralski method (hereinafter referred to as the LEC method) in which the surface of melt from which a single crystal is pulled is covered with a liquid sealant, such as $B_2O_3$, and an inert gas pressure is applied onto the liquid sealant in order to suppress the escape of the volatile component. In a second method, the surface of the melt is covered with an atmosphere of a volatile component gas of a dissociative compound with a controlled pressure throughout the crystal growth operation. The first method has been industrially widely employed because of the simplicity of the apparatus.

However, the LEC method has presented difficulties in providing high quality crystals for the following reasons.

1. It is impossible to obtain a precisely controlled stoichiometry in the resulting crystal by control of evaporation pressure.

2. It is not easy to reduce the temperature gradient across the solid-liquid interface, because with low temperature gradient the escape of volatile component increases.

In order to practice the second method, as previously disclosed in U.S. Pat. application Ser. No. 644,840, filed Aug. 28, 1984 (corresponding to Japanese Patent Application Nos. 58-157 883 and 59-109 632), the present inventors have proposed an apparatus for pulling crystals in an atmosphere of a volatile component gas of a dissociative compound wherein an inner chamber contained in the crystal pulling apparatus is sealed and the pressure of a volatile component gas within the inner chamber is precisely controlled.

The practical process for pulling crystals using the apparatus proposed by our previous application set forth above is illustrated by referring FIG. 5. The inner chamber 1, 2 for sealing the volatile component gas of the dissociative compound is made of a material which is not subject to attack by the volatile component gas atmosphere and the chamber is constructed so as to be capable of being divided at its junction portions 3. At the junction portions 3, a liquid or solid sealant 7 is used and the divided chamber portions are pressed to each other by a driving shaft 13 to ensure tight sealing. A spring 8 as a stressrelaxation mechanism or alternatively a load cell as an automatic control mechanism of the pushing-up force, both of which are provided on the driving shaft, can keep the chamber free from any excessive stress due to thermal expansion, etc. Such a structural arrangement not only provides a satisfactory sealing performance of the chamber, but also make possible repeated use of the chamber. The use of liquid $B_2O_3$ in rotating seals 15 permits a pulling shaft 5 and a crucible supporting shaft 14 to be moved vertically and rotated. The pressure of a volatile component gas within the sealed chamber is controlled by keeping the temperature of a pressure controlling furnace 10 not only constant but also lower than any other parts of the sealed chamber wall, and condensing the volatile component 11 at the projected part in the furnace 10. The growing crystal in the growth chamber can be observed through an optical transparent rod 9 during the pulling operation.

Such a specially designed apparatus, unlike any other known apparatus made of quartz, extremely facilitates the dividing and sealing operations of the chamber, thereby making possible not only repeated use of the chamber but also the production of large diameter crystals. The advantages have made the apparatus more useful in industrial applications. Incidentally, in the figure, other reference numerals are as follows:

4: crucible, 6: single crystal, 12: heater, 16: crucible pedestal, 17: melt, and 39: outer chamber of the whole apparatus.

However, the apparatus in FIG. 5 developed by the inventors to carry out the foregoing second method has been found to have the following disadvantages by further investigation, namely:

In the inner chamber 1 and 2, the temperature is highest at the crucible portion and is lower toward the upper portion. At the projected portion of the volatile component gas pressure controlling furnace 10, the temperature is lowest.

Such a temperature profile can be supposed to cause a violent convection in the gas within the inner chamber. Actually, fluctuations of image caused due to the changes in the density of the atmospheric gas within the chamber are observed through the optical transparent rod 9 after melting the source material. Such a convection means that the gas pressure in the chamber varies widely from place to place and is unstable with respect to time. This is unfavorable for the purpose of controlling precisely the stoichiometry under a constant gas pressure. Therefore, a further improvement is demanded in order to apply stably the pressure of the volatile component gas pressure controlling furnace 10 onto the surface of the melt without being subjected to any influence of the convection.

Further, the same problem also arises from a temperature profile of the melt contained in the crucible. In the pulling process, the crucible is located at a position slightly higher than the highest-temperature position in the inner chamber and the temperature in the melt is gradually reduced toward the upper portion. Such a temperature gradient will unavoidably cause convection in the melt.

A random flow of heat due to the convection will give rise to an irregular change in the temperature at the solid-liquid interface and is undesirable for the purpose of stoichiometric control under constant conditions. In addition, the thermal convection in the melt hinders a steady crystal growth and, microscopically, will introduce various crystal lattice defects into a grown crystal as a result of repetition of solidification and remelting.

In view of the above, it is highly desirable to suppress the foregoing convection in the gas of the volatile component of the dissociative compound in the sealed chamber and the convection in the melt within the crucible and thereby make it possible to pull under the conditions of constant pressure and constant temperature.

SUMMARY OF THE INVENTION

Therefore, an object of the present invention is to eliminate the foregoing disadvantages or problems encountered in the known methods and, more particularly, to provide an improved method for growing single crystals of a dissociative compound free from the convection problems without requiring any complicated or troublesome operation.

According to the present invention, there is provided a method for growing single crystals of a dissociative compound semiconductor which are pulled in an atmosphere of a gas of a volatile component of the dissociative compound filled in an inner chamber sealed within a growth apparatus, wherein the space of the inner chamber is divided by means of a partition wall, which is disposed in the inner chamber and the lower part of which is immersed in a melt contained in a crucible, into the spaces of:

(a) a narrow space for communicating between a volatile component gas pressure controlling portion disposed on the wall of the inner chamber and the melt surface of the dissociative compound contained in the crucible;

(b) a space partitioned with the partition wall extending downward in the melt contained in the crucible and a fractional area of the surface of the melt which is covered with a liquid sealant serving to seal the melt from the gas of the volatile component; and the spaces being communicated with each other through narrow communication openings, the single crystals being grown in the space (b).

In the method according to the present invention, the partition wall is constituted of a single structure or a separable composite structure capable of being divided into two parts, an upper member and a lower member. In the latter partition wall, the lower member is made so as to float in the melt and the upper end part of the lower member is inserted into the upper member in such a manner that the lower member can be moved vertically. Further, the lower member may have a base wall at its lower end and small holes at and/or near the base wall.

DETAILED DESCRIPTION OF THE PREFERRED EMBODIMENTS

The present invention will now be explained in detail by referring to the accompanying drawings.

Although gallium arsenide is taken as an example of dissociative compounds hereinafter, the present invention is not limited to this specific example. The present invention can be applied to other dissociative compounds. In FIG. 1 to FIG. 4, the outer chamber, the heaters and the optical transparent rod (corresponding to numerals 39, 12 and 9, respectively, in FIG. 5) are omitted for the sake of brevity.

Figure 1:
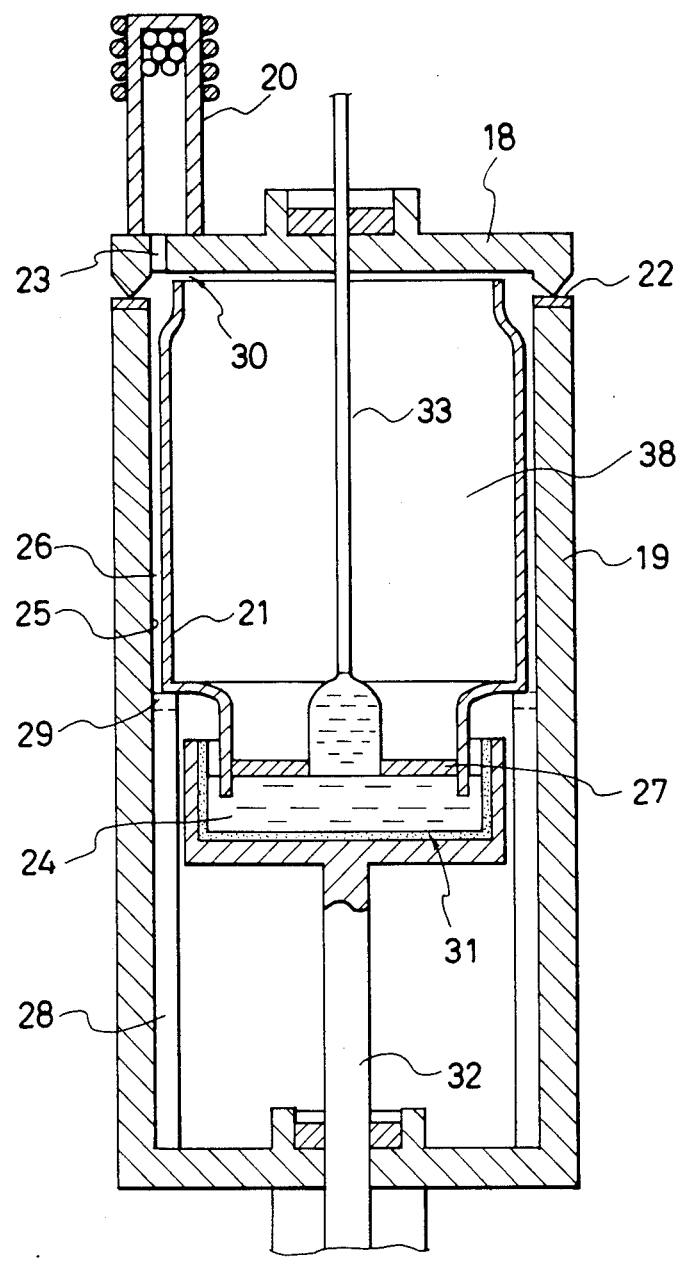
FIG. 1 to FIG. 4 are schematic cross-sectional views of apparatuses suitable for carrying out the present invention.

In FIG. 1, an inner chamber for sealing an arsenic atmosphere comprising an upper chamber portion 18 and a lower chamber portion 19 is so constructed that it can be divided at junction portions 22 of the upper and lower chamber portions 18 and 19 and an As pressure controlling portion 20 is projected from its upper part. Numeral 21 is a partition wall and the partition wall 21 and an inner wall 25 of the inner chamber form a communication passage 26 starting from an opening 23 of the As pressure controlling portion 20 and reaching the surface of a melt 24. The lower end of the partition wall 21 is immersed in the melt 24 contained in a crucible 31. In the surface of the melt 24, the portion surrounded with the partition wall 21 is covered with a liquid sealant ($B_2O_3$) 27 and crystals are grown from this part of the melt. The foregoing partition wall 21 is supported by a support 28 at an appropriate position of the lower chamber portion 19. Interconnection holes 29 are formed in several places of the top end of the support 28 on which the partition wall 21 is placed. The upper end part of the partition wall 21 is close to the lower face of the upper inner chamber portion 18 with a narrow opening 30.

In the practical use of such a crystal pulling apparatus, a suitable amount of metallic arsenic is placed at the bottom of the inner chamber and the crucible 31 is put on a lower rotation shaft 32 at an appropriate position. After charging a melt of gallium in the crucible 31, the partition wall 21 is disposed as shown in FIG. 1. Further, a lump of $B_2O_3$ in an appropriate amount is placed on the fractional part of the gallium melt surface surrounded with the immersed lower part of the partition wall 21. The whole pulling apparatus is evacuated and then the bottom of the lower chamber portion 19 is pushed up to bring the lower chamber portion 19 into contact with the upper chamber portion 18 at the junction portion 22, thereby the inner chamber is sealed. The arsenic placed at the inner chamber bottom is heated by a lower heater (not shown) and volatilized, thereby allowing gallium arsenide to be directly synthesized. At the same time, the As pressure controlling portion 20 is maintained at the temperature corresponding to the desired As pressure and at this portion the volatilized arsenic is condensed. Thereafter, a seed crystal held on the end of a pulling shaft 33 is brought down to make contact with the melt surface and crystal growth operation is carried out in a usual manner.

Figure 2:
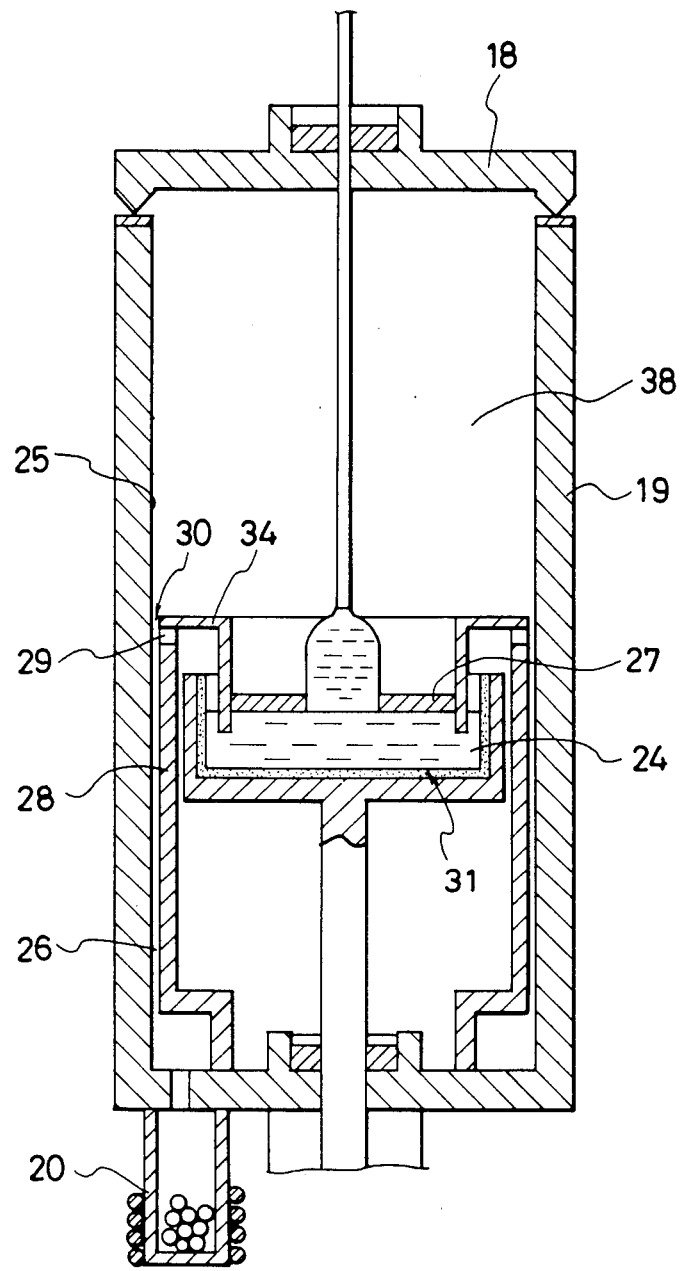

FIG. 2 shows another embodiment of the apparatus according to the present invention in which an As pressure controlling portion 20 is disposed at the bottom of a lower chamber portion 19. In this arrangement, the temperature is increased in the direction of from the As pressure controlling portion 20 to a crucible 31 and, thus, a vigorous convection will not be caused in this zone. However, in order to avoid an unpredictable turbulence, a narrow passage 26 formed between a support 28 and the inner wall 25 of the inner chamber is effectively employed. The partition wall 34 allows the passage 26 to be connected with the surface of the melt 24 through interconnection holes 29 and shields the As pressure controlling passage from a wide upper space 38 of the inner chamber above the melt 24. However, since a small opening 30 is formed between the inner wall 25 of the lower chamber portion 19 and the partition wall 34, the upper space is allowed to be readily filled with an As atmosphere. In the melt surface, the surface area surrounded with the immersed lower part of the partition wall 34 is covered with a liquid sealant ($B_2O_3$) 27 and crystals are pulled from this area portion.

In the two embodiments described above, the partition wall is fixed to the inner chamber. Although the surface level of the melt is lowered with crystal growth, the lower end of the partition wall can be safely retained in the melt by raising the position of the crucible depending the amount used for crystal growth.

Figure 3:
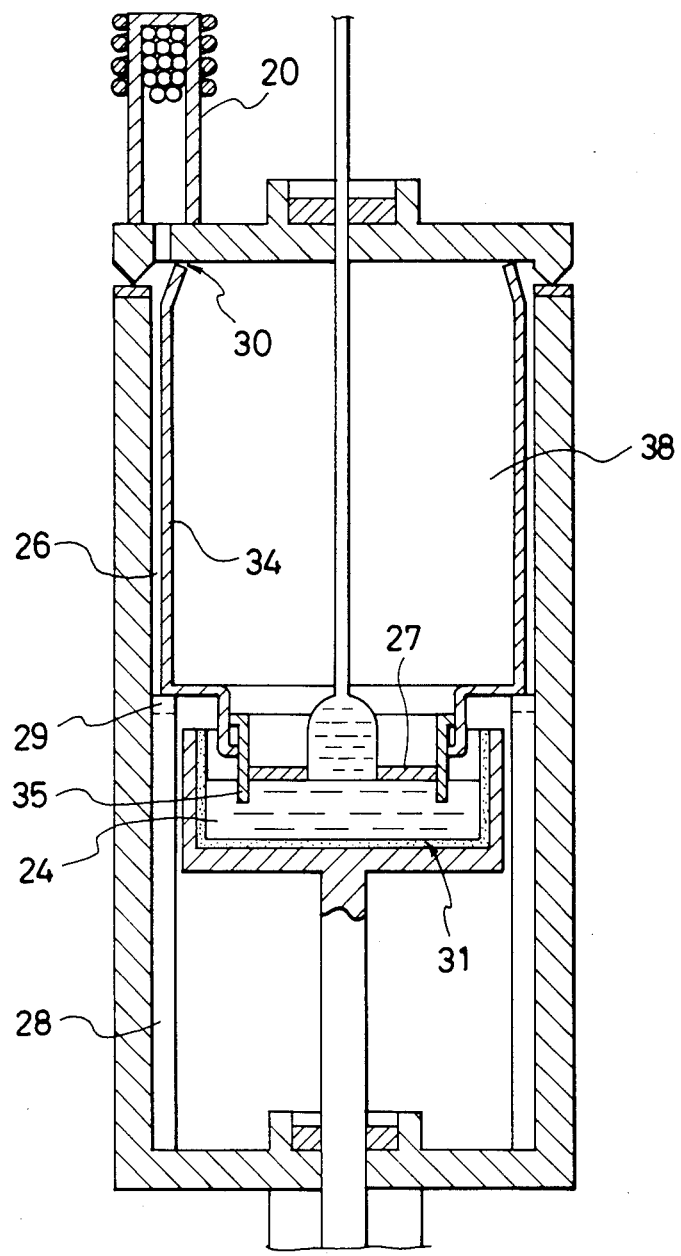
Figure 4:
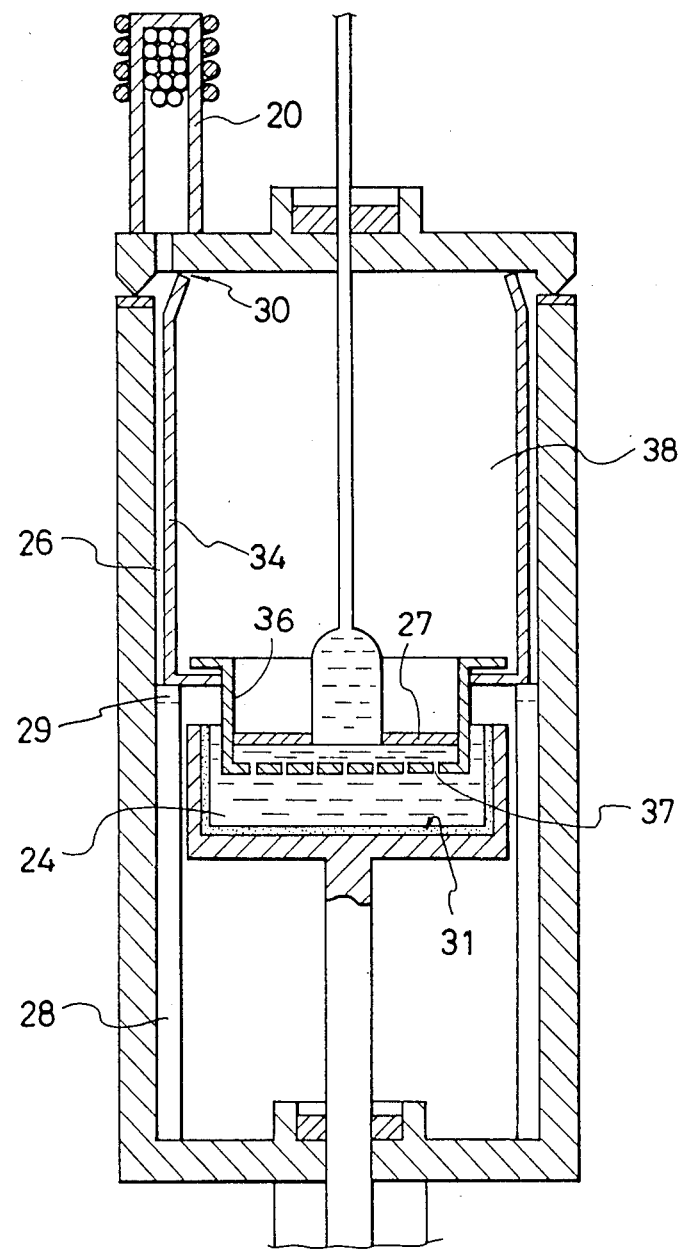
Figure 5:
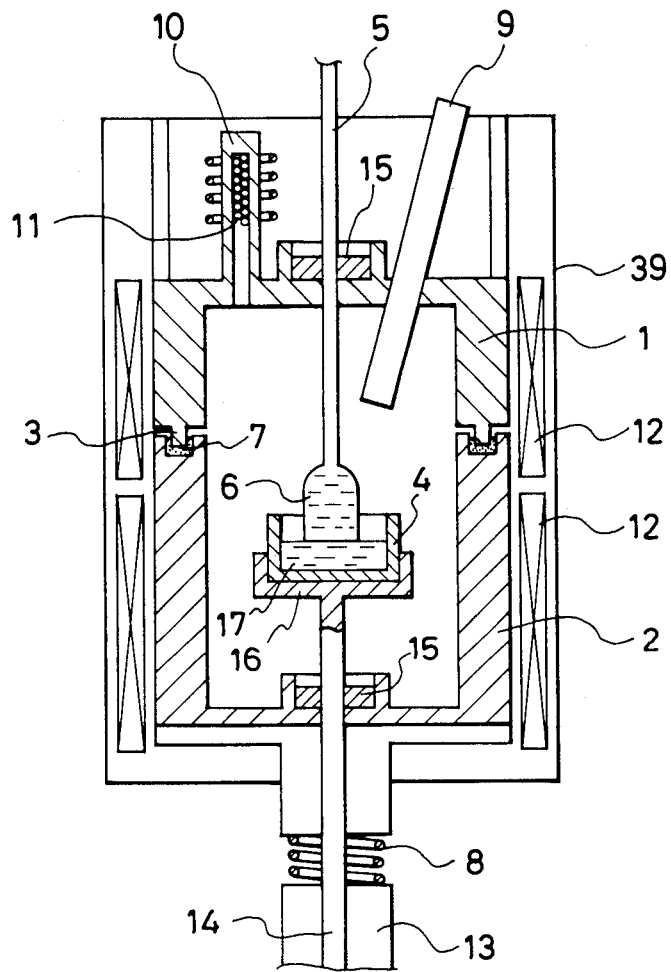
FIG. 5 is a cross-sectional view, of a crystal growth apparatus in Ser. No. 644,840.

Alternatively, the partition wall may be made of a separable wall capable of being divided into two parts, an upper member and a lower member. The lower member may be made of a material capable of floating in the melt and inserted as a movable float into the lower end of the upper member. As an example, FIG. 3 illustrates a cylindrical float 35 being opened at its lower end in which the upper portion of the lower member is inserted into the upper member of the partition wall 34. Further, FIG. 4 shows another example in which a cup-shaped vessel-like float 36 with a bottom is inserted into the upper member of the partition wall 34. Small holes 37 are formed at and/or near the bottom of the float 36, thereby permitting the melt to pass freely the holes 37. As illustrated in FIG. 3 and FIG. 4, when the lower member of the partition wall 34 is formed in a float type, the lower float member of the partition wall is lowered corresponding to the lowering of the melt surface level and thus would not be exposed from the surface of the melt, even should the crucible be fixedly positioned.

As materials for the partition wall having such a structure, it is essential to meet the following requirements, namely:

They withstand an As gas atmosphere at an elevated temperature and do not cause contamination problem in the melt. Particularly, care for these requirements should be taken for the portion to be immersed in the melt. Of course, it is required that they can be formed into the desired form. Further, there should be an appropriate difference in specific gravity between the float member and the melt.

The effects produced by such a partition wall can be considered as follows.

As shown in FIG. 1, when the passage space 26 between the inner wall 25 of the inner chamber and the partition wall 21 is sufficiently narrow, the surface of the partition wall serves as a barrier to convection thereby suppressing the convection even if the passage is long and there is a large temperature difference therein. Further, since the temperature difference in the space between the partition wall and the crucible is only slight, convection can be neglected in this space. Therefore when this space is shielded from the upper space unfavorable effects of the convection caused in the upper space can be prevented. Consequently, the pressure of the As pressure controlling portion can be applied onto the free surface of the melt without causing any time-fluctuation.

The wide space 38 for crystal growth is also filled with an As atmosphere since the passage for controlling an arsenic gas pressure which is shielded by the partition wall from the crytstal growth space 38 is allowed to communicate with the space for the crystal growth through the interconnection opening 30 as shown in FIG. 1 to FIG. 4 and further a gap at junction portion of the partition wall 34 and the float 35, as shown in FIG. 3 and FIG. 4. Since the opening and gap are sufficiently small, convection occurring in the wide space 38 where crystal growth is carried out has only a slight influence to the As pressure controlling passage. The As atmosphere prevents the escape of arsenic from a growing crystal. The $B_2O_3$ liquid sealant on the melt prevents the communication between the melt beneath the $B_2O_3$ liquid sealant and the atmospheric gas and further acts to reduce the concentration of impurity atoms like Si and C in the melt.

As shown in FIG. 3 and FIG. 4, when the portion of the partition wall to be immersed into the melt is formed in a float type, the following advantages can be obtained, namely:

In case where the partition wall is fixedly arranged, the crucible should be raised corresponding to the degree of the crystal growth in order to retain constantly a given length of the lower portion of the partition wall in the melt throughout the crystal growth operation. When the position of the crucible is not precisely controlled, the end of the partition wall will be exposed out of the melt or strike against the bottom of the crucible, thereby causing damage of the crucible or the partition wall. In contrast to this, since the float type partition wall is immersed in the melt to the predetermined length without complicated control as set forth above, the operation is facilitated. As another advantage, selection of materials for the partition wall is broadened, since the upper part which is not placed in a direct contact with the melt may be made of materials different from the materials used in the float portion. The requirements of the material for the upper part are not so strict as for the float portion.

Moreover, when the float is made in a vessel-like form having a bottom wall (shown in FIG. 4), the following advantages can be attained. Namely, a crystal is grown in the concave portion of the float and the molten source material consumed for crystal growth is fed through small interconnection holes formed at the bottom of the float and/or the side wall near the bottom. Convection due to the temperature difference in the vertical direction of the melt outside the float does not reach the melt within the float because the bottom of the float acts as a barrier. Further, since the melt contained within the float is sufficiently shallow, the temperature in this melt can be regarded as sufficiently uniform and convection is not caused.

Although the partition wall is opened at its lower end, as shown in FIG. 1, FIG. 2 and FIG. 3, the portion immersed in the melt acts as a barrier to the horizontal movement of convection in the melt. The foregoing vessel-like type partition wall is more advantageous in that the vessel-like partition wall has the further effect of preventing the vertical movement of the melt.

As described above, the partition wall of this invention divides the space within the inner chamber for growing single crystals of dissociative compounds into a zone for crystal growth and the As pressure controlling passage in which the passage part is made sufficiently narrow so as to keep the melt free from any undesirable effect of the convection in gas within the crystal growth zone. The end part of the partition wall immersed into the melt or the vertically movable float which is inserted into the upper member of the partition wall and immersed in the melt reduces convection in the melt. The interconnection opening formed in the partition wall or the gap between the partition wall and the inner chamber permits the crystal growth zone to be filled with the gas of the volatile component of the dissociative compound.

Hereinafter, the present invention will be explained with reference to the detailed example.

EXAMPLE

In an actual embodiment, an apparatus for growing single crystals of gallium arsenide was employed. The partition wall composed of a single structure, as shown in FIG. 2, were made of pyrolytic boron nitride (PBN). Liquid gallium in the amount of about 0.7 kg was charged into a PBN crucible with a diameter of 100 mm and about 0.8 kg of metallic arsenic was placed in the bottom of the inner chamber. The crucible was raised so that the end of the partition wall was immersed in the liquid gallium and then 100 g of a $B_2O_3$ piece was placed in the crucible. The inner chamber was tightly sealed after being evacuated and the temperature of a heater was raised to 1260° C. to directly synthesise gallium arsenide. During this process, the As pressure controlling portion was maintained at about 610° C. The amount of the molten source material consumed for crystal growth was detected by weight sensing means provided on the pull shaft and the position of the crucible was automatically controlled. The crystal thus pulled was semi-insulating and its EPD (etch pit density) does not exceed $2000/cm^2$ except in the periphery and was uniform from the top to the end of the ingot of the crystal within a length of 10 cm and a diameter of 5 cm.

With the composite type partition wall divisible into two parts, as shown in FIG. 4, the upper part was made of carbon entirely coated with PBN and the float of PBN. Since the used PBN and molten gallium arsenide had specific gravites of 2.1 $g/cm^3$ and 5.71 $g/cm^3$, respectively, the float can be immersed to the desired depth depending on its form. The position of the crucible was automatically controlled as described above. Pulling was carried out in the same manner as described above and semi-insulating crystal with a further improved EPD not exceeding $1000/cm^2$ was obtained.

As described above in detail, in the apparatus according to the present invention, the narrow passage is formed between the volatile component gas pressure controlling portion and the melt contained in the crucible by using the partition wall within the crystal growth chamber for sealing a gas of a volatile component of a semiconductive compound, and thereby pressure of the pressure controlling portion can be steadily transmitted to the melt without being subjected to any substantial influence due to the violent convection in the gas sealed within the crystal growth chamber. At the same time, crystal growth can be carried out in an atmosphere of the gas of the volatile component. In the melt surface, the portion surrounded with the partition wall is sealed with a liquid sealant and thus melt in this portion does not react with the atmosphere within the crystal growth chamber. More specifically, the space of the inner crystal growth chamber is divided into three parts in function, namely, a part for transmitting the gas pressure of the volatile component, a part for the crystal growth and a remaining part. Further, when the lower part of the partition wall to be immersed in the melt is made as a vertically movable float type, there can be obtained further advantageous effects in respects of operation and cost. Moreover, a vessel-like float can suppress more effectively convection in the melt.

According to the present invention, the partition wall suppresses convection in the gas and melt at the same time and makes possible a stoichiometric control of the crystal by the control of the pressure of the volatile component gas, providing a substantial effect in improving the quality of grown crystals. Further, uniformity and yield in the obtained ingots can be expected to be greatly improved.

What is claimed is:

1. In a method for growing a single crystal of a dissociative compound semiconductor which is pulled in an atmosphere of a volatile component gas of said dissociative compound filled in an inner chamber sealed within a crystal growth apparatus, the improvement comprising growing said crystal in said crystal growth apparatus having a partition wall disposed in said inner chamber, said partition wall having a lower part immersed in a melt contained in a crucible and providing, (a) a narrow space communicating between a volatile-component-gas, pressure-controlling portion disposed on a wall of said inner chamber and said melt on the dissociative compound contained in said crucible said narrow space being sufficiently small to prevent the turbulent flow of gas therein; and (b) a wide space in which said single crystal is grown, said wide space being partitioned from said narrow space (a) by said partition wall, said partition wall extending downwardly in said melt contained in said crucible, a fractional area of the surface of said melt which is covered with a liquid sealant serving to seal said melt from said volatile component gas; and said spaces being communicated with each other through narrow communication openings, and pulling said single crystal from said fractional area of the surface of said melt through said liquid sealant while the remainder of the surface of said melt is maintained in contact with an atmosphere of said volatile component gas by means of said narrow space so that the pressure of said atmosphere of said volatile component gas on said remainder of the surface of said melt is constant.

2. A method as claimed in claim 1, in which said partition wall is made of a single cylindrical structure.

3. A method as claimed in claim 1, in which said partition wall is constituted of a separable composite structure comprised of an upper member and a lower member, said lower member being floated in said melt, the upper end of said lower member being vertically movably inserted into said upper member.

4. A method as claimed in claim 3, in which said lower member has a base wall at its lower end and underlying said fractional area of the surface of said melt, and small holes are formed at and/or near said base wall.

5. A method of forming a single crystal of a dissociative compound semiconductor in a growth chamber having a sidewall and having a wall portion for controlling the pressure of a volatile gas which is a volatile component of said dissociative compound, comprising the steps of: placing an end of a partition wall into a melt of a dissociative semiconductor compound in a crucible in said growth chamber so that said partition wall projects above the upper surface of said melt and isolates a first, central, fractional area of the upper surface of said melt from a second, peripheral, fractional area thereof, the portions of said melt below said first and second fractional areas being in fluid flow communication with each other below the upper surface of said melt, said partition wall extending into close proximity with, but being spaced inwardly from, said sidewall of said chamber at a location close to the upper end of said crucible above said second peripheral fractional area of said melt and thence extending alongside said sidewall to a location close to said wall portion for controlling the pressure of the volatile gas, said partition wall defining with said sidewall of said growth chamber a narrow passage extending from said wall portion to the zone in said crucible which is directly above said second peripheral area of said melt, said narrow passage being isolated from the space above said first central fractional area of said melt by said partition wall, the width of said narrow passage being sufficiently small to prevent turbulent flow of gas through said narrow passage;

covering said first fractional area of said melt with a layer of a liquid sealant so that said liquid sealant directly contacts and covers said first fractional area and simultaneously maintaining said second fractional area of said melt uncovered, said second fractional area being exposed through said narrow passage to direct contact with a pressurized ambient atmosphere containing a gas of a volatile component of said dissociative compound; and pulling a single crystal of said dissociative compound from said first fractional area of said melt through said liquid sealant so that said liquid sealant surrounds and contacts the periphery of the single crystal as it is pulled from said melt, the surface of said second peripheral area of said melt being maintained in contact with an atmosphere of a gas of a volatile component of said dissociative compound by means of said narrow passage so that the pressure of said atmosphere of said gas on the surface of said second peripheral area is maintained constant during the crystal pulling.

6. A method as claimed in claim 5 in which said liquid sealant is $B_2O_3$.

7. A method as claimed in claim 5 in which said partition wall is stationary with respect to said growth chamber while the single crystal is being pulled and including the step of moving said crucible upwardly during the pulling of the single crystal so as to maintain the lower end of said partition wall at a substantially constant depth in said melt.

8. A method as claimed in claim 5 in which said wall portion for controlling the pressure of said volatile gas comprises a hollow compartment projecting from said growth chamber, means for controlling the temperature of said hollow compartment whereby to maintain the pressure of said volatile gas at a selected value, said hollow compartment communicating with said narrow passage and with said growth chamber through which the single crystal is pulled.

9. A method as claimed in claim 5 in which said partition wall comprises a stationary upper portion and a vertically movable lower portion capable of floating in said melt and moving vertically with respect to said stationary upper portion and including the step of moving said lower portion downwardly during the pulling of the single crystal so as to maintain the lower end of said lower poriton at a substantially constant depth in said melt.

* * * * *